US012607935B2

(12) United States Patent
Cao

(10) Patent No.: US 12,607,935 B2
(45) Date of Patent: Apr. 21, 2026

(54) METHOD OF FORMING PHOTORESIST PATTERN, AND PHOTORESIST STRUCTURE

(71) Applicant: CHANGXIN MEMORY TECHNOLOGIES, INC., Hefei (CN)

(72) Inventor: Kanyu Cao, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 877 days.

(21) Appl. No.: 17/814,032

(22) Filed: Jul. 21, 2022

(65) Prior Publication Data

US 2023/0185193 A1    Jun. 15, 2023

Related U.S. Application Data

(63) Continuation of application No. PCT/CN2022/091990, filed on May 10, 2022.

(30) Foreign Application Priority Data

Dec. 13, 2021    (CN) .......................... 202111515560.7

(51) Int. Cl.
*G03F 7/09* (2006.01)
*G03F 7/16* (2006.01)
*G03F 7/20* (2006.01)

(52) U.S. Cl.
CPC .............. *G03F 7/091* (2013.01); *G03F 7/168* (2013.01); *G03F 7/20* (2013.01)

(58) Field of Classification Search
CPC . G03F 7/091; G03F 7/168; G03F 7/20; G03F 7/095; G03F 7/70325
See application file for complete search history.

(56) References Cited

U.S. PATENT DOCUMENTS

| 8,012,666 B2 | 9/2011 | Gallagher et al. |
| 2002/0076626 A1 | 6/2002 | Montgomery et al. |

(Continued)

FOREIGN PATENT DOCUMENTS

| CN | 1472599 A | 2/2004 |
| CN | 101019075 A | 8/2007 |

(Continued)

OTHER PUBLICATIONS

JP2005051243 English Translation (Year: 2025).*

(Continued)

*Primary Examiner* — Mark F. Huff
*Assistant Examiner* — Kevin J Drummey
(74) *Attorney, Agent, or Firm* — Syncoda LLC; Feng Ma

(57) ABSTRACT

The present disclosure relates to the technical field of semiconductors, and provides a method of forming a photoresist pattern, and a photoresist structure. The method of forming a photoresist pattern includes: forming a photoresist structure on a target layer, where the photoresist structure includes a photoresist layer provided on the target layer, and an optical wave transmission layer provided on the photoresist layer; and performing exposure processing on the photoresist structure in a first medium, to form an exposure image in the photoresist layer, where the optical wave transmission layer is configured to improve lithographic resolution of the photoresist layer.

9 Claims, 5 Drawing Sheets

(56)                    References Cited

U.S. PATENT DOCUMENTS

| | | | |
|---|---|---|---|
| 2007/0003867 A1 | 1/2007 | Hatakeyama et al. | |
| 2008/0171285 A1 | 7/2008 | Patterson et al. | |
| 2011/0262859 A1 | 10/2011 | Kusabiraki et al. | |
| 2015/0316846 A1* | 11/2015 | Zi | G03F 7/11 |
| | | | 430/319 |
| 2020/0105522 A1* | 4/2020 | Liu | G03F 7/201 |

FOREIGN PATENT DOCUMENTS

| | | | |
|---|---|---|---|
| CN | 101042534 A | | 9/2007 |
| CN | 101558357 A | | 10/2009 |
| CN | 113156770 A | | 7/2021 |
| JP | 2005051243 A | * | 2/2005 |
| JP | 2005234015 A | | 9/2005 |
| JP | 2007264459 A | | 10/2007 |
| TW | I621921 B | | 4/2018 |
| WO | 2007007619 A1 | | 1/2007 |

OTHER PUBLICATIONS

CN first office action in application No. 202111515560.7, mailed on Jun. 17, 2025.

International Search Report cited in PCT/CN2022/091990 mailed Sep. 16, 2022, 11 pages.

* cited by examiner

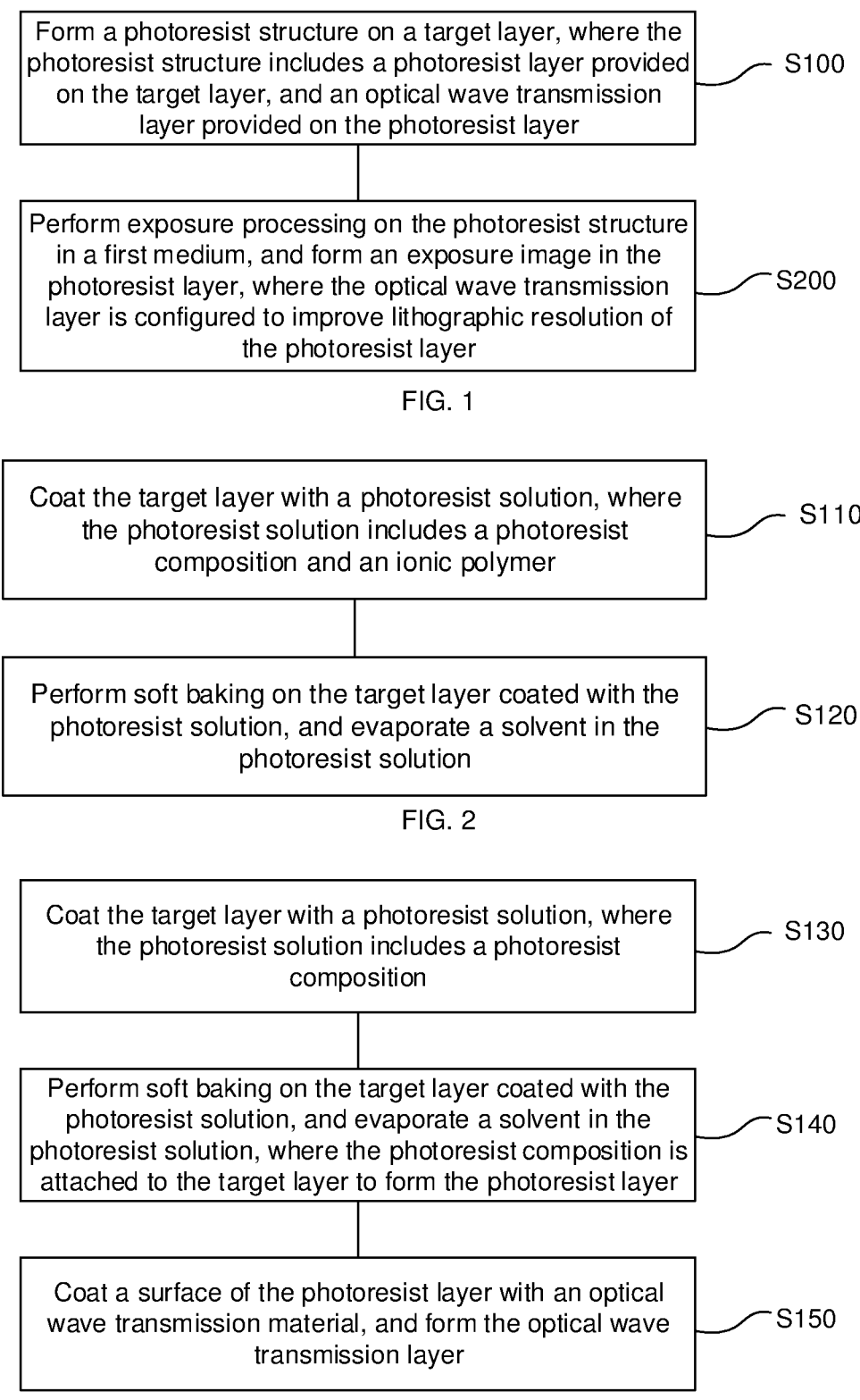

Form a photoresist structure on a target layer, where the photoresist structure includes a photoresist layer provided on the target layer, and an optical wave transmission layer provided on the photoresist layer — S100

Perform exposure processing on the photoresist structure in a first medium, and form an exposure image in the photoresist layer, where the optical wave transmission layer is configured to improve lithographic resolution of the photoresist layer — S200

FIG. 1

Coat the target layer with a photoresist solution, where the photoresist solution includes a photoresist composition and an ionic polymer — S110:

Perform soft baking on the target layer coated with the photoresist solution, and evaporate a solvent in the photoresist solution — S120

FIG. 2

Coat the target layer with a photoresist solution, where the photoresist solution includes a photoresist composition — S130

Perform soft baking on the target layer coated with the photoresist solution, and evaporate a solvent in the photoresist solution, where the photoresist composition is attached to the target layer to form the photoresist layer — S140

Coat a surface of the photoresist layer with an optical wave transmission material, and form the optical wave transmission layer — S150

FIG. 3

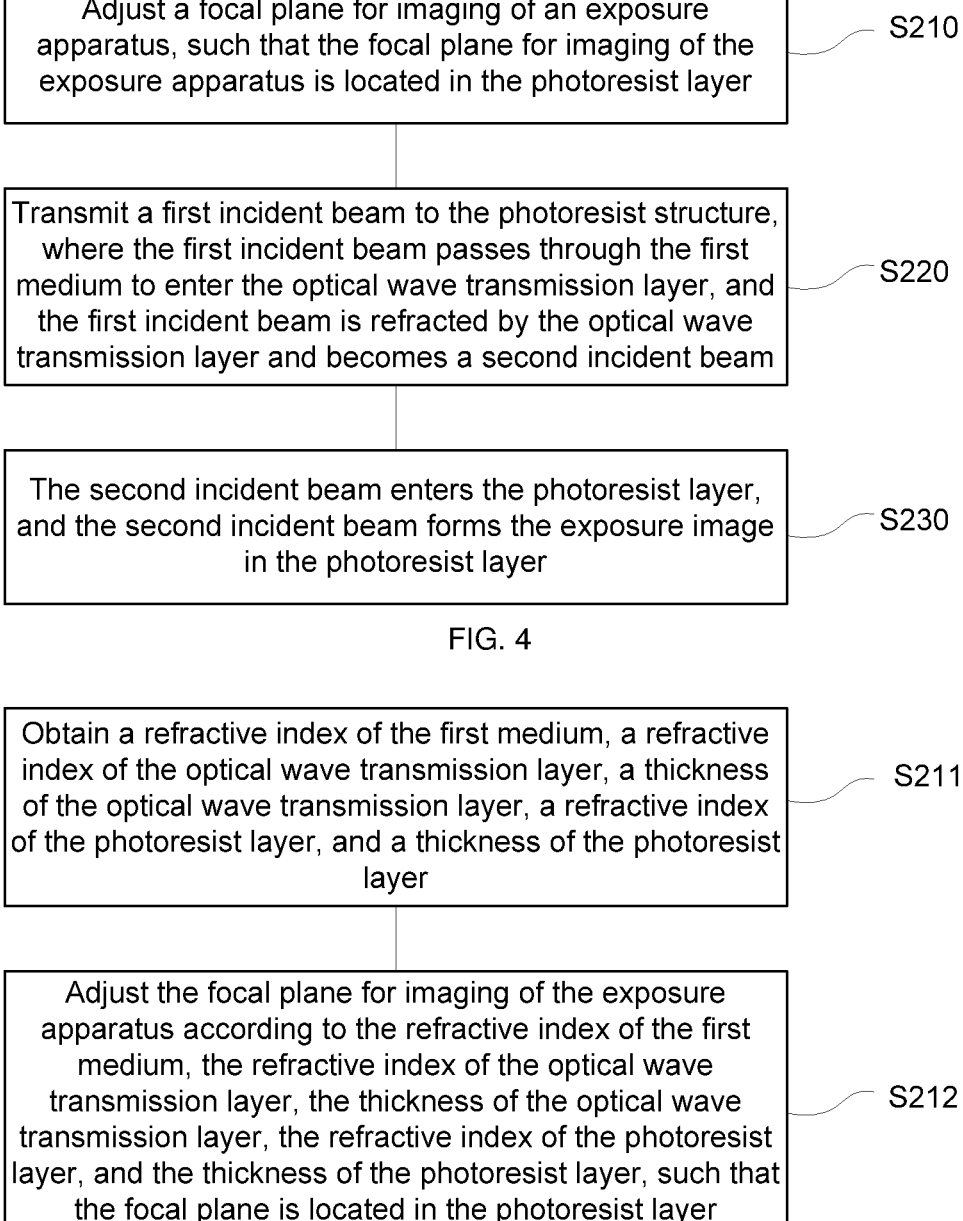

Adjust a focal plane for imaging of an exposure apparatus, such that the focal plane for imaging of the exposure apparatus is located in the photoresist layer ⌐ S210

Transmit a first incident beam to the photoresist structure, where the first incident beam passes through the first medium to enter the optical wave transmission layer, and the first incident beam is refracted by the optical wave transmission layer and becomes a second incident beam ⌐ S220

The second incident beam enters the photoresist layer, and the second incident beam forms the exposure image in the photoresist layer ⌐ S230

FIG. 4

Obtain a refractive index of the first medium, a refractive index of the optical wave transmission layer, a thickness of the optical wave transmission layer, a refractive index of the photoresist layer, and a thickness of the photoresist layer ⌐ S211

Adjust the focal plane for imaging of the exposure apparatus according to the refractive index of the first medium, the refractive index of the optical wave transmission layer, the thickness of the optical wave transmission layer, the refractive index of the photoresist layer, and the thickness of the photoresist layer, such that the focal plane is located in the photoresist layer ⌐ S212

FIG. 5

| Form a photoresist structure on a target layer, where the photoresist structure includes a photoresist layer provided on the target layer, and an optical wave transmission layer provided on the photoresist layer | S10 |

| Provide a mask plate, where a mask pattern is formed on the mask plate | S20 |

| Perform exposure processing on the photoresist structure based on the mask plate, to form an exposure image in the photoresist layer | S30 |

| Remove the optical wave transmission layer | S40 |

| Perform development processing on the photoresist layer, to pattern the photoresist layer to form a photoresist pattern | S50 |

| Perform hard baking on the photoresist layer | S60 |

FIG. 6

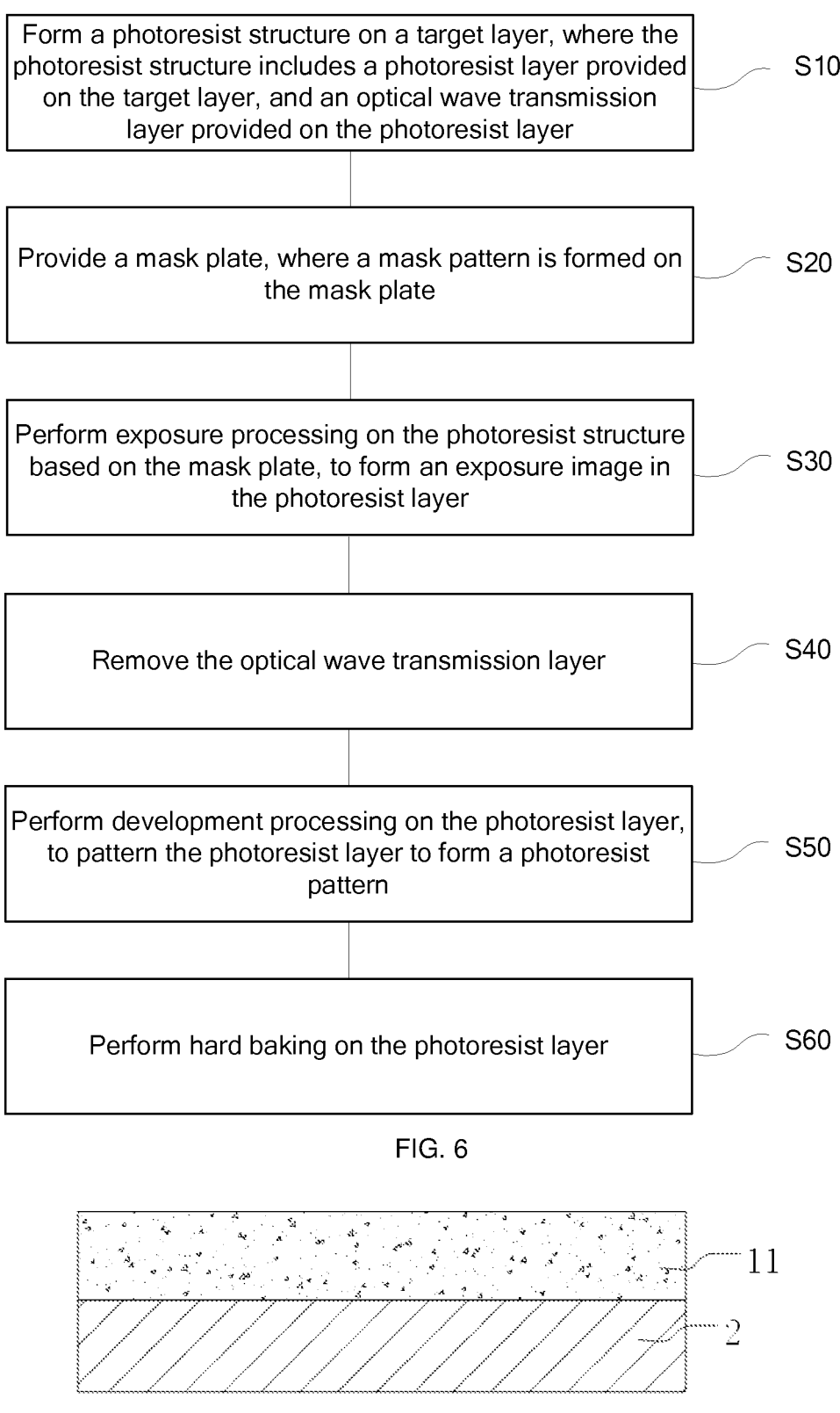

METHOD OF FORMING PHOTORESIST PATTERN, AND PHOTORESIST STRUCTURE

CROSS-REFERENCE TO RELATED APPLICATIONS

This is a continuation of International Application No. PCT/CN2022/091990, filed on May 10, 2022, which is based on and claims the priority to Chinese Patent Application No. 202111515560.7, titled "METHOD OF FORMING PHOTORESIST PATTERN, AND PHOTORESIST STRUCTURE" and filed on Dec. 13, 2021. The entire contents of International Application No. PCT/CN2022/091990 and Chinese Patent Application No. 202111515560.7 are herein incorporated into the present disclosure by reference.

TECHNICAL FIELD

The present disclosure relates to, but is not limited to, a method of forming a photoresist pattern, and a photoresist structure.

BACKGROUND

As one of the most important process steps in the manufacturing of integrated circuits (ICs), the lithography process is used to form a desired pattern on a semiconductor substrate. With the development of the IC process and the shrinking of critical dimensions of semiconductor components, the photolithography process is required to have higher precision.

SUMMARY

An overview of the subject matter detailed in the present disclosure is provided below, which is not intended to limit the protection scope of the claims.

The present disclosure provides a method of forming a photoresist pattern, and a photoresist structure.

According to a first aspect, the present disclosure provides a method of forming a photoresist pattern. The method includes:

forming a photoresist structure on a target layer, where the photoresist structure includes a photoresist layer provided on the target layer, and an optical wave transmission layer provided on the photoresist layer; and performing exposure processing on the photoresist structure in a first medium, and forming an exposure image in the photoresist layer, where the optical wave transmission layer is configured to improve lithographic resolution of the photoresist layer.

A second aspect of the present disclosure provides a photoresist structure, where the semiconductor structure includes:

a photoresist layer, provided on a target layer; and an optical wave transmission layer, provided on the photoresist layer, where the optical wave transmission layer is configured to improve lithographic resolution of the photoresist layer.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

FIG. 1 is a flowchart of a method of forming a photoresist pattern according to an exemplary embodiment.

FIG. 2 is a flowchart of forming a photoresist structure in a method of forming a photoresist pattern according to an exemplary embodiment.

FIG. 3 is a flowchart of forming a photoresist structure in a method of forming a photoresist pattern according to an exemplary embodiment.

FIG. 4 is a flowchart of exposure processing in a method of forming a photoresist pattern according to an exemplary embodiment.

FIG. 5 is a flowchart of adjusting a focal plane for imaging of an exposure apparatus in a method of forming a photoresist pattern according to an exemplary embodiment.

FIG. 6 is a flowchart of a method of forming a photoresist pattern according to an exemplary embodiment.

FIG. 7 is a schematic diagram of forming a photoresist film on a target layer in a method of forming a photoresist pattern according to an exemplary embodiment.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An exemplary embodiment of the present disclosure provides a method of forming a photoresist pattern, as shown in FIG. 1. FIG. 1 is a flowchart of a method of forming a photoresist pattern according to an exemplary embodiment of the present disclosure. FIG. 7 to FIG. 15 are schematic diagrams of various stages of the method of forming a photoresist pattern. The method of forming a photoresist pattern is described below with reference to FIG. 7 to FIG. 15.

As shown in FIG. 1, an exemplary embodiment of the present disclosure provides a method of forming a photoresist pattern. The method includes:

Step S100: Form a photoresist structure on a target layer, where the photoresist structure includes a photoresist layer provided on the target layer, and an optical wave transmission layer provided on the photoresist layer.

Figure 9:
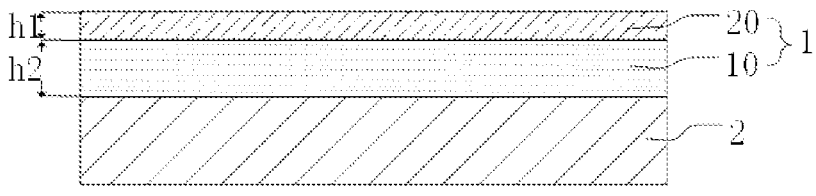
FIG. 9 is a schematic diagram of a photoresist structure provided in a method of forming a photoresist pattern according to an exemplary embodiment.

As shown in FIG. 9, the photoresist structure 1 includes the photoresist layer 10 covering the target layer 2 and the optical wave transmission layer 20 covering the photoresist layer 10. The optical wave transmission layer 20 is configured to improve lithographic resolution of the photoresist layer 10. For example, the optical wave transmission layer 20 is used for converting a wavelength of optical waves entering the photoresist layer 10, to reduce the wavelength of the optical waves entering the photoresist layer 10.

The target layer 2 refers to a to-be-etched material layer that needs to be patterned. The target layer may be a semiconductor substrate, or a semiconductor material layer for forming semiconductor elements, for example, a dielectric layer or a metal layer. The semiconductor substrate may be made of silicon (Si), germanium (Ge), silicon-germanium (GeSi), or silicon carbide (SiC); or may be silicon on insulator (SOI) or germanium on insulator (GOI); or may be another material such as gallium arsenide or other III-V compounds. The semiconductor substrate may be doped with certain impurity ions as required, and the impurity ions may be N-type impurity ions or p-type impurity ions. The semiconductor material layer may be an amorphous carbon layer, an oxide layer, a nitride layer, a copper layer, a tungsten layer, an aluminum layer, or the like, but is not limited thereto.

Step S200: Perform exposure processing on the photoresist structure in a first medium, and form an exposure image in the photoresist layer, where the optical wave transmission layer is configured to improve lithographic resolution of the photoresist layer.

Figure 10:
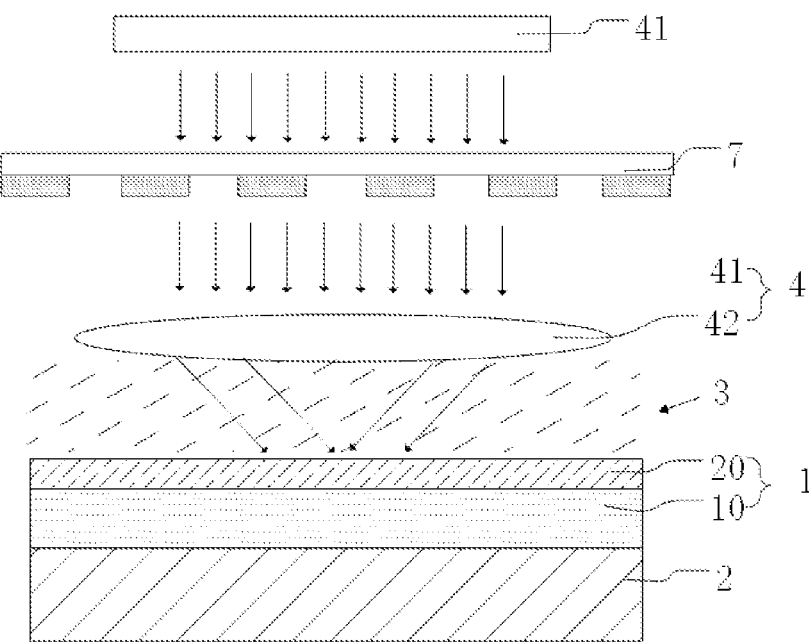
FIG. 10 is a schematic diagram of exposure processing performed by an exposure apparatus on a photoresist structure in a method of forming a photoresist pattern according to an exemplary embodiment.
Figure 13:
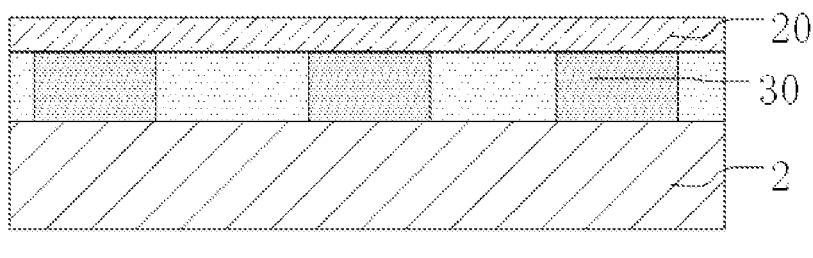
FIG. 13 is a schematic diagram of forming an exposure image in a photoresist structure in a method of forming a photoresist pattern according to an exemplary embodiment.

As shown in FIG. 10 and FIG. 13, during exposure processing of the photoresist structure 1, the target layer 2 covered by the photoresist structure 1 is placed in the first medium 3, and an incident beam is transmitted from the first medium 3 to the target layer 2. After passing through the optical wave transmission layer 20, the incident beam is converted into a beam with a smaller wavelength, which enters the photoresist layer 10, to form an exposure image 30 in the photoresist layer 10.

In the lithography process, lithographic resolution affects the quality of the exposure image. With higher lithographic resolution, the formed exposure image has higher precision. The lithographic resolution follows the Rayleigh formula:

$$R = k_1 \frac{\lambda}{NA}$$

where R is a lithographic resolution; k1 is a process constant; $\lambda$ is an exposure wavelength; NA is a numerical aperture (NA) of a projection lens for emitting the incident beam.

The lithographic resolution is used for representing a minimum achievable line width in the lithography process. According to the Rayleigh formula, a smaller wavelength of the incident optical wave and a smaller process constant can result in a smaller line width, that is, higher lithographic precision.

In the method of forming a photoresist pattern in some embodiments, a wavelength of exposure light entering the photoresist layer can be reduced by the optical wave transmission layer, to improve the lithographic resolution. Therefore, the exposure image formed on the photoresist layer has higher precision, and therefore can be used in an exposure process with a smaller lithographic critical dimension and more complex and diverse structures.

In the method of forming a photoresist pattern in some embodiments, the optical wave transmission layer can be made of a material with high light absorption. For example, a metal oxide may be added to the photoresist to improve the light absorption of the optical wave transmission layer; further, a polymer-bonded photo-acid generator added with color-absorbing groups may be used to improve the light absorption of the optical wave transmission layer. By improving the light sensing speed of the optical wave transmission layer, uneven development caused by uneven distribution of the photo-acid generator has less impact on the resolution of the photoresist layer, so as to improve the lithographic resolution of the photoresist layer.

According to an exemplary embodiment, implementation of S100 is described. In the implementation process, as shown in FIG. 2, the forming a photoresist structure on a target layer includes:

Step S110: Coat the target layer with a photoresist solution, where the photoresist solution includes a photoresist composite and an ionic polymer.

In some embodiments, the photoresist solution mainly includes a photoresist composite, an ionic polymer, and a solvent, where the photoresist composite includes a polymer resin, a photo-acid generator and a corresponding additive. As shown in FIG. 7, an ionic polymer for forming a photoresist conversion layer is added in the photoresist solution, and a mass percentage of the ionic polymer in the photoresist solution is 5% to 20%. For example, the mass percentage of the ionic polymer in the photoresist solution may be 8%, 10%, 13%, 16% or 18%. The photoresist solution is coated on the target layer to form a photoresist film 11, where the photoresist film 11 includes the ionic polymer.

Step S120: Perform soft baking on the target layer coated with the photoresist solution, and evaporate a solvent in the photoresist solution.

Referring to FIG. 9, through soft baking, the target layer 2 coated with the photoresist solution is heated. In the heating process, partial solvent in the photoresist solution diffuses towards a direction away from the target layer 2 to escape from the photoresist film 11. When solvent molecules escape, the photoresist composite is diffused to the target layer 2 to form the photoresist layer 10 on a top surface of the target layer 2; the ionic polymer and solvent molecules diffuse towards the direction away from the target layer 2, and the ionic polymer forms the optical wave transmission layer 20 on a top surface of the photoresist layer 10.

In some embodiments, temperature and time of the soft baking are set according to components of the target layer 2 and the photoresist composite as well as a type of an incident beam in the subsequent exposure processing. For example, the temperature of the soft baking may be 80° C. to 110° C., such as 85° C., 90° C., 95° C. or 105° C.; and the time of the soft baking may be 50 seconds to 80 seconds. In some embodiments, the target layer 2 coated with the photoresist solution is placed in a 100° C. environment for 60 seconds.

In the method of forming a photoresist structure in some embodiments, the ionic polymer is added to the photoresist solution; in the soft baking, the ionic polymer and solvent molecules diffuse towards the direction away from the target layer, the solvent molecules escape from the photoresist solution, and the ionic polymer is gathered on the top surface of the photoresist solution to form the optical wave transmission layer, such that the photoresist solution is layered to form the photoresist layer and the optical wave transmission layer provided on the photoresist layer. The method in some embodiments has fewer processes and reduces the manufacturing time.

According to an exemplary embodiment, this embodiment is a description of the implementation of step S100. In the implementation process, as shown in FIG. 3, the forming a photoresist structure on a target layer includes:

Step S130: Coat the target layer with a photoresist solution, where the photoresist solution includes a photoresist composite.

Figure 8:
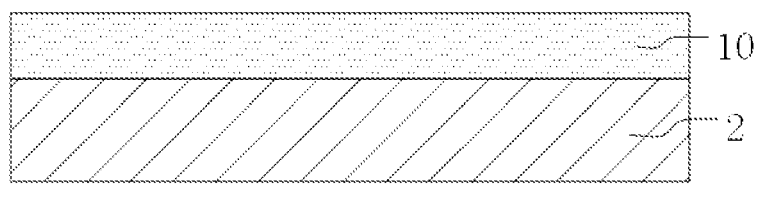
FIG. 8 is a schematic diagram of forming a photoresist layer on a target layer in a method of forming a photoresist pattern according to an exemplary embodiment.

In some embodiments, the photoresist solution mainly includes a photoresist composite and a solvent, where the photoresist composite includes a polymer resin, a photo-acid generator and a corresponding additive. Referring to FIG. 8, the photoresist solution is coated on the target layer 2, where a mass percentage of the solvent in the photoresist solution is 10% to 30%.

Step S140: Perform soft baking on the target layer coated with the photoresist solution, and evaporate a solvent in the photoresist solution, where the photoresist composite is attached to the target layer to form the photoresist layer.

Referring to FIG. 8, through soft baking, the target layer 2 coated with the photoresist solution is heated, and partial solvent in the photoresist solution escapes under heat, such that the content of the solvent in the photoresist solution is reduced. The retained photoresist solution forms the photoresist layer 10 on the surface of the target layer 2. The photoresist composite in the photoresist layer 10 has higher concentration, and the photoresist layer 10 has higher light sensitivity. In some embodiments, the target layer 2 coated with the photoresist solution may be placed in a 100° C. environment for 60 seconds.

Step S150: Coat a surface of the photoresist layer with an optical wave transmission material, and form the optical wave transmission layer.

Referring to FIG. 9, the optical wave transmission material is coated on the surface of the photoresist layer 10, to form the optical wave transmission layer 20. In some embodiments, the optical wave transmission layer is made of a light-transmitting material, such that the incident beam can pass through the optical wave transmission layer 20 to enter the photoresist layer 10, ensuring the implementation of the exposure processing.

In some embodiments, the optical wave transmission material includes, but is not limited to, water, a chemically amplified resist, a molecular glass resist, an ionic polymer or the like.

In some embodiments, the photoresist layer and the optical wave transmission layer are formed separately, which reduces the process difficulty, and the formed photoresist structure has a higher yield.

According to an exemplary embodiment, the implementation of step S200 is described with some embodiments. In the implementation process, the exposure processing is performed in an exposure apparatus; as shown in FIG. 4, the performing exposure processing on the photoresist structure in a first medium, to form an exposure image in the photoresist layer includes:

Step S210: Adjust a focal plane for imaging of the exposure apparatus, such that the focal plane for imaging of the exposure apparatus is located in the photoresist layer.

Figure 11:
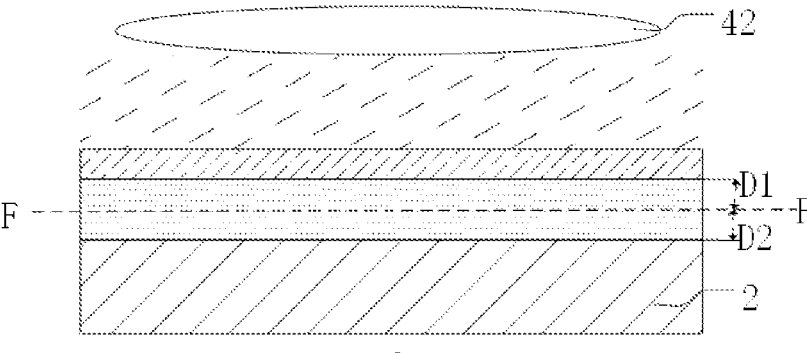
FIG. 11 is a schematic diagram of a focal plane of the exposure apparatus shown in FIG. 10.

As shown in FIG. 11 with reference to FIG. 9, the photoresist structure 1 to be exposed includes the stacked photoresist layer 10 and optical wave transmission layer 20. To ensure that the exposure image can be formed in the photoresist layer 10, before exposure of the photoresist structure 1, the focal plane F-F for imaging of the exposure apparatus 4 is first adjusted to be located in the photoresist layer 10, to ensure that the exposure image 30 is formed in the photoresist layer 10.

In some embodiments, after the incident beam emitted by the exposure apparatus 4 passes through the optical wave transmission layer 20, the wavelength of the incident beam is changed. Therefore, in some embodiments, the focal plane F-F for imaging of the exposure apparatus 4 is adjusted according to the wavelength before the incident passes through the optical wave transmission layer 20 and the wavelength after the incident passes through the optical wave transmission layer 20, to ensure that the incident beam passing through the optical wave transmission layer 20 can enter the photoresist layer 10, to form the exposure image 30 in the photoresist layer 10.

Step S220: Transmit a first incident beam to the photoresist structure, where the first incident beam passes through the first medium to enter the optical wave transmission layer, and the first incident beam is refracted by the optical wave transmission layer and becomes a second incident beam.

Figure 12:
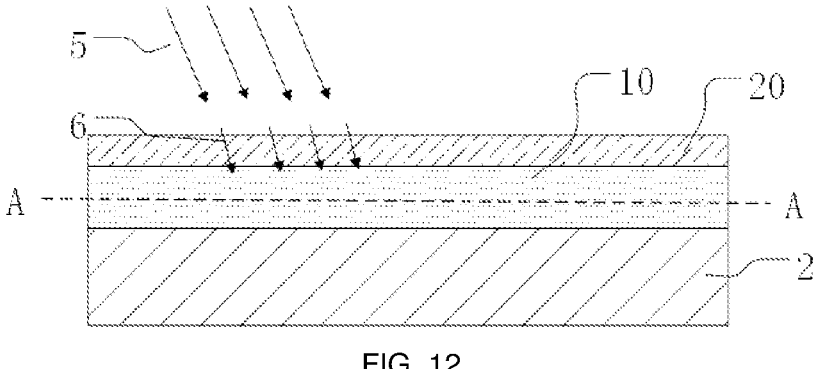
FIG. 12 is a schematic diagram of exposure processing on a photoresist structure in a method of forming a photoresist pattern according to an exemplary embodiment.

As shown in FIG. 12 with reference to FIG. 10, the first incident beam 5 has a first wavelength $\lambda 1$, and the second incident beam 6 has a second wavelength $\lambda 2$, where the second wavelength is less than the first wavelength, that is, $\lambda 2 < \lambda 1$.

In some embodiments, a refractive index of the first medium 3 is n1, and a refractive index of the optical wave transmission layer 20 is n2, where n2>n1. That is, the refractive index n2 of the optical wave transmission layer 20 is greater than the refractive index n1 of the first medium 3. For example, when the first medium 3 is air, the refractive index n2 of the optical wave transmission layer 20 is greater than 1; when the first medium 3 is water, the refractive index n2 of the optical wave transmission layer 20 is greater than 1.44.

Light propagates in two propagation medium layers with different refractive indexes; a relationship between the wavelength and the refractive index is as follows:

$$\lambda 2 = \frac{\lambda 1 \times n1}{n2}.$$

In some embodiments, the refractive index n2 of the optical wave transmission layer 20 is greater than the refractive index n1 of the first medium 3, and the first incident beam 5 enters the optical wave transmission layer 20 from the first medium 3. When the first incident beam 5 enters a propagation medium with a higher refractive index from a propagation medium with a lower refractive index, the first incident beam 5 is converted into the second incident beam 6.

In some embodiments, the refractive index of the first medium 3 refers to a light refractive index of the first medium 3 to the incident beam, and the refractive index of the optical wave transmission layer 20 refers to a light refractive index of the optical wave transmission layer 20 to the incident beam. For example, when the incident beam is deep ultraviolet (DUV), the refractive index refers to a refractive index to DUV.

Step S230: The second incident beam enters the photoresist layer, and the second incident beam forms the exposure image in the photoresist layer.

In some embodiments, as shown in FIG. 12 and FIG. 13, the first incident beam 5 is refracted by the optical wave transmission layer 20, to convert the first incident beam 5 into a second incident beam 6 with a smaller wavelength. The second incident beam 6 enters the photoresist layer 10 to form, in the focal plane F-F for imaging of the exposure apparatus 4, an exposure image with higher lithographic resolution.

In some embodiments, an optical wave transmission layer is arranged on a propagation path along which the incident beam enters the photoresist layer. The refractive index of the light propagation medium changes, to convert the first incident beam into a second incident beam with a smaller wavelength, which reduces the wavelength of light entering the photoresist layer and overcomes the difficulty in further reducing the wavelength of light from lithography equipment due to restrictions of the equipment and process development in the lithography process.

According to an exemplary embodiment, the optical wave transmission layer 20 is sensitive to optical waves of the third wavelength $\lambda3$, and is not sensitive to light of the first wavelength $\lambda1$ and the second wavelength $\lambda2$. In some embodiments, in the process of converting the first incident beam 5 into the second incident beam 6 by the optical wave transmission layer 20, the optical wave transmission layer 20 will not be exposed by the first incident beam 5 or the second incident beam 6, ensuring that the exposure image 30 is formed only in the photoresist layer 10.

According to an exemplary embodiment, referring to FIG. 8 and FIG. 10, a refractive index of the photoresist layer 10 is n3, and the refractive index n3 of the photoresist layer 10 is greater than the refractive index n2 of the optical wave transmission layer 20: n3>n2. That is, the refractive index n2 of the optical wave transmission layer 20 is less than the refractive index n3 of the photoresist layer 10 and greater than the refractive index n1 of the first medium 3.

In some embodiments, referring to FIG. 10, FIG. 12, and FIG. 13, the first incident beam 5 is transmitted from the exposure apparatus 4 to the photoresist layer 10, to form the exposure image 30. When the first incident beam 5 enters the optical wave transmission layer 20 from the first medium 3, under the effect of the increased refractive index of the propagation medium, the first incident beam 5 is converted at the interface between the first medium 3 and the optical wave transmission layer 20. The first incident beam 5, of which the wavelength is reduced, becomes the second incident beam 6. The second incident beam 6 enters the photoresist layer 10 from the optical wave transmission layer 20. Under the effect of the increased refractive index of the propagation medium, the second incident beam 6 is converted at the interface between the optical wave transmission layer 20 and the photoresist layer 10. The wavelength of the second incident beam 6 is reduced. The second incident beam 6 forms an exposure image with higher precision in the photoresist layer 10.

In some embodiments, by adjusting the refractive indexes of the first medium, the optical wave transmission layer, and the photoresist layer, a propagation medium layer with a gradually increasing refractive index is formed along the incidence light of the incident beam. In this way, when the incident beam sequentially passes through the first medium and the optical wave transmission layer to enter the photoresist layer, the incident optical waves are converted twice, that is, the wavelength of the incident optical waves is reduced twice. Through the impact of the propagation medium on the optical wavelength, the wavelength of light for exposure in the photoresist layer to form the exposure image is reduced, which further improves the resolution and the quality of the formed photoresist pattern.

According to an exemplary embodiment, as shown in FIG. 9, a thickness h1 of the optical wave transmission layer 20 is less than a thickness h2 of the photoresist layer 10, to prevent the optical wave transmission layer 20 from absorbing too much optical waves and ensure the light transmittance of the incident beam when entering the photoresist layer 10 from the optical wave transmission layer 20. In some embodiments, the thickness h1 of the optical wave transmission layer 20 is set to be as small as possible, to reduce optical waves absorbed by the optical wave transmission layer 20 and improve the light transmittance of the incident beam, such that the formed exposure image has higher precision.

In some embodiments, the thickness h1 of the optical wave transmission layer 20 is greater than $\frac{1}{10}$ of the first wavelength $\lambda1$, such that the first incident beam 5 can be is refracted by the optical wave transmission layer 20 when passing through the optical wave transmission layer 20. For example, the optical wavelength of the lithography equipment includes, but is not limited to, G-line (436 nm), I-line (365 nm), KrF (248 nm), ArF (193 nm), and extreme ultraviolet (EUV) (13.5 nm). Correspondingly, for example, when KrF lithography equipment is used, the thickness h1 of the optical wave transmission layer 20 may be greater than 24.8 nm; when ArF lithography equipment is used, the thickness h1 of the optical wave transmission layer 20 may be greater than 19.3 nm; when EUV lithography equipment is used, the thickness h1 of the optical wave transmission layer 20 may be greater than 1.35 nm.

According to an exemplary embodiment, in some embodiments, the implementation of step S210 is described with some embodiments. In the implementation process, as shown in FIG. 5, the adjusting a focal plane for imaging of the exposure apparatus, such that the focal plane for imaging of the exposure apparatus is located in the photoresist layer includes:

Step S211: Obtain a refractive index of the first medium, a refractive index of the optical wave transmission layer, a thickness of the optical wave transmission layer, a refractive index of the photoresist layer, and a thickness of the photoresist layer.

Referring to FIG. 10, the wavelength of the beam has changed before the exposure image 30 is formed in the photoresist layer 10. Therefore, to ensure that the beam with the changed wavelength can form the exposure image 30 in the photoresist layer 10, it is necessary to obtain the refractive index n1 of the first medium 3, the refractive index n2 of the optical wave transmission layer 20, the refractive index n3 of the photoresist layer 10, the thickness h1 of the optical wave transmission layer 20, and the thickness h2 of the photoresist layer 10.

Step S212: Adjust the focal plane for imaging of the exposure apparatus according to the refractive index of the first medium, the refractive index of the optical wave transmission layer, the thickness of the optical wave transmission layer, the refractive index of the photoresist layer, and the thickness of the photoresist layer, such that the focal plane is located in the photoresist layer.

Referring to FIG. 10 and FIG. 11, the adjusting the focal plane F-F for exposure of the exposure apparatus 4 includes: adjusting the focal plane F-F for imaging of the exposure apparatus 4 by comprehensively considering the refractive index n1 of the first medium 3, the refractive index n2 of the optical wave transmission layer 20, the refractive index n3 of the photoresist layer 10, the thickness h1 of the optical wave transmission layer 20, and the thickness h2 of the photoresist layer 10.

In some embodiments, by obtaining the information of the first medium, the optical wave transmission layer, and the photoresist layer as well as the information of the exposure apparatus, the focal plane for imaging of the exposure apparatus is adjusted, such that the adjustment result is more precise. The focal plane for imaging of the exposure apparatus is located in the photoresist layer, to ensure that the exposure beam can form the exposure image in the photoresist layer.

According to an exemplary embodiment, referring to FIG. 11 and FIG. 12, along the stacking direction, the focal plane F-F for imaging of the exposure apparatus 4 is formed in a plane in which a central line A-A of the photoresist layer 10 is located. The photoresist layer 10 is located between a front focal depth D1 and a back focal depth D2 for imaging of the exposure apparatus 4.

In some embodiments, the focal plane F-F for imaging of the exposure apparatus 4 is formed in the plane in which the central line A-A of the photoresist layer 10 is located, to ensure that the exposure image 30 formed in the photoresist layer 10 has higher precision and the formed photoresist pattern has higher dimensional precision.

A region between the front focal depth and the back focal depth for imaging of the exposure apparatus is an exposure region. The photoresist layer is located between the front focal depth and the back focal depth for imaging of the exposure apparatus. That is, along a thickness direction of the photoresist layer, the photoresist layer is located in the exposure region, to ensure that all regions from the top surface to the bottom surface of the photoresist layer can be exposed, avoiding the problem that the photoresist pattern is incomplete because the exposure image is not formed in a partial region of the photoresist layer.

In some embodiments, referring to FIG. 9, the photoresist layer 10 has a thickness h2. Referring to FIG. 11, the front focal depth D1 for imaging of the exposure apparatus 4 is greater than or equal to half of the thickness of the photoresist layer 10, that is, the front focal depth D1 for imaging of the exposure apparatus 4 is greater than or equal to h2/2. Referring to FIG. 11, the back focal depth D2 for imaging of the exposure apparatus 4 is greater than or equal to h2/2, such that the exposure image 30 can be formed over the entire thickness of the photoresist layer 10 through the exposure processing.

In some embodiments, the thickness of the photoresist layer is the region where the exposure image is formed. The exposure image is completely formed in the photoresist layer, which reduces the waste of exposure beams and improving the light utilization.

As shown in FIG. 6, an exemplary embodiment of the present disclosure provides a method of forming a photoresist pattern. The method includes:

Step S10: Form a photoresist structure on a target layer, where the photoresist structure includes a photoresist layer provided on the target layer, and an optical wave transmission layer provided on the photoresist layer.

Step S10 in some embodiments is implemented in the same manner as step S100 of the foregoing embodiment, and will not be described in detail again herein.

Step S20: Provide a mask plate, where a mask pattern is formed on the mask plate.

As shown in FIG. 10, an exposure apparatus 4 is provided. The exposure apparatus 4 includes an exposure light source 41 and a projection lens 42. A mask plate 7 that includes a mask pattern is provided. The mask plate 7 is disposed between the exposure light source 41 and the projection lens 42. The photoresist structure 1 is disposed under the projection lens 42 of the exposure apparatus 4, and the exposure apparatus 4 is adjusted, such that the projection lens 42 is aligned with the photoresist structure 1.

The exposure apparatus 4 may be a lithography machine, such as a lithography machine or an immersion lithography machine. The exposure light source 41 may be, but not limited to, a DUV source or an EUV source. A first medium 3 exists between the projection lens 42 and the photoresist structure 1, where the first medium 3 is gas or liquid. When the first medium 3 is liquid, the projection lens 42 and the photoresist structure 1 are submerged in the first medium 3. For example, the first medium 3 may be air or water. When the first medium 3 is air, the refractive index n2 of the optical wave transmission layer 20 is greater than 1; when the first medium 3 is water, the refractive index n2 of the optical wave transmission layer 20 is greater than 1.44.

Step S30: Perform exposure processing on the photoresist structure based on the mask plate, to form an exposure image in the photoresist layer.

As shown in FIG. 10, exposure processing is performed on the photoresist structure 1 in the first medium 3, and the optical wave transmission layer 20 is configured to reduce the wavelength of optical waves entering the photoresist layer 10 from the first medium 3.

In some embodiments, as shown in FIG. 10 and FIG. 12, the exposure light source 41 emits light source beam to the photoresist structure 1 perpendicularly. A part of the light source beam enters the projection lens 42 through the mask plate 7; the projection lens 42 focuses the light source beam, and refracts the light source beam to be a first incident beam 5, where the first incident beam 5 has a wavelength $\lambda 1$. The first incident beam 5 passes through the optical wave transmission layer 20, and is refracted by the optical wave transmission layer 20 to be a second incident beam 6, where the second incident beam 6 has a wavelength $\lambda 2$, and $\lambda 2$ is less than $\lambda 1$. As shown in FIG. 13, the second incident beam 6 enters the photoresist layer 10. The photoresist layer 10 irradiated by the second incident beam 6 senses light and undergoes a photosensitive chemical reaction, to form an exposure image 30, where the exposure image 30 is a micro-image of the mask pattern. The photoresist of the photoresist layer 10 generally can be divided into two types: positive photoresist and negative photoresist. In terms of the photosensitive chemical reaction, if long-chain molecules of the polymer in the photoresist composite are truncated into short-chain molecules by light, the photoresist is a positive photoresist; if short-chain molecules of the polymer in the photoresist composite are cross-linked into long-chain molecules by light, the photoresist is a negative photoresist. A short-chain molecular polymer can be dissolved by a developing solution. Therefore, the exposed part of the positive photoresist is removed, while the exposed part of the negative photoresist is retained.

Step S40: Remove the optical wave transmission layer.

Figure 14:
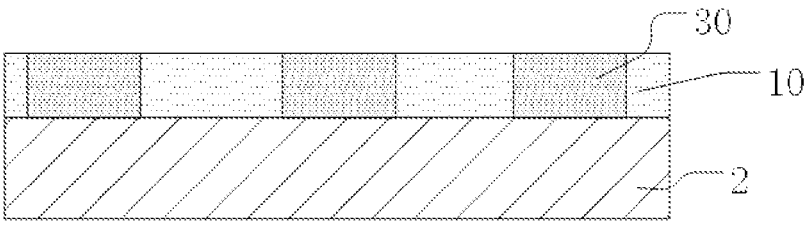
FIG. 14 is a schematic diagram of removing an optical wave transmission layer in a method of forming a photoresist pattern according to an exemplary embodiment.

As shown in FIG. 14 with reference to FIG. 13, the optical wave transmission layer 20 is stripped from the photoresist layer 10, to facilitate the development processing for the photoresist layer 10.

In some embodiments, the optical wave transmission layer 20 may be stripped from the photoresist layer 10 by a stripper through a dry stripping process with oxygen, or the optical wave transmission layer 20 may be stripped from the photoresist layer 10 by a developer through a development process.

Step S50: Perform development processing on the photoresist layer, to pattern the photoresist layer to form a photoresist pattern.

Figure 15:
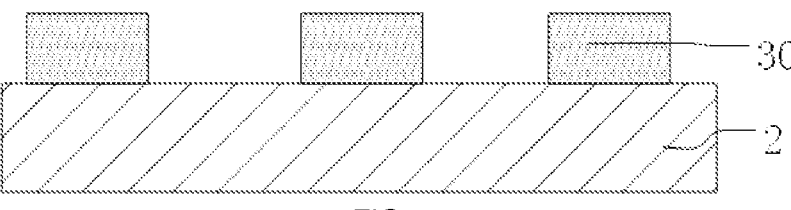
FIG. 15 is a schematic diagram of development processing on a photoresist layer in a method of forming a photoresist pattern according to an exemplary embodiment.

As shown in FIG. 15 with reference to FIG. 14, a developing solution is sprayed to the photoresist layer 10. The developing solution is distributed over the entire surface of the photoresist layer 10, such that the photoresist layer 10 can be completely submerged in the developing solution. The developing solution reacts with a soluble region in the photoresist layer 10, to dissolve the soluble region in the photoresist layer 10, such that the exposure image 30 is developed in the photoresist layer to form the photoresist pattern. For the negative photoresist, an organic solvent developing solution is generally used; for the positive photoresist, a water-soluble alkali developing solution, such as tetramethyl ammonium hydroxide (TMAH), is generally used. A negative development process can also be used for the positive photoresist.

In the method of forming a photoresist pattern according to some embodiments, the photoresist layer 10 is developed after the optical wave transmission layer 20 is removed, which reduces the impact of the optical wave transmission layer 20 on the resolution of the photoresist layer 10.

In some embodiments, a development time is adjusted according to the components of the photoresist layer 10 and the concentration of the developing solution, such that the soluble photoresist layer 10 can be fully dissolved in the developing solution without causing overdevelopment that affects the contour of the formed.

After the development processing for the photoresist layer 10, the photoresist layer 10 is cleaned, to remove the developing solution in which the photoresist is dissolved and the excess developing solution. Deionized water may be sprayed to the photoresist layer 10. The deionized water flows to take away the developing solution in which the photoresist is dissolved and the excess developing solution.

Step S60: Perform hard baking on the photoresist layer.

Hard making is performed on the retained photoresist layer 10 at a temperature of 130° C. to 200° C. The hard making lasts 20 to 40 minutes, such that the solvent in the photoresist layer 10 escaped completely, while the photoresist layer 10 is further aggregated to enhance its etching resistance.

In the method according to some embodiments, the optical wave transmission layer improves the lithographic resolution of the photoresist pattern. The photoresist pattern is a micro-image of the mask pattern, and the formed photoresist pattern has lower boundary roughness, and the photoresist pattern has high dimensional precision.

An exemplary embodiment of the present disclosure provides a photoresist structure. As shown in FIG. 9, the photoresist structure includes: a photoresist layer 10 and an optical wave transmission layer 20. The photoresist layer 10 is provided on the target layer 2, and the optical wave transmission layer 20 is provided on the photoresist layer 10. The optical wave transmission layer 20 is configured to reduce a wavelength of optical waves entering the photoresist layer 10 from a first medium 3 (referring to FIG. 10).

In the photoresist structure according to some embodiments, the optical wave transmission layer 20 is provided on the photoresist layer 10. The optical wave transmission layer 20 can reduce the wavelength of the optical waves entering the photoresist layer 10 from the first medium 3, thus improving the lithographic resolution. Therefore, the photoresist structure can form a photoresist pattern with higher precision and more complex and diverse structures.

According to an exemplary embodiment, as shown in FIG. 9, a refractive index n2 of the optical wave transmission layer 20 is greater than a refractive index n1 of the first medium 3 (referring to FIG. 10); the refractive index n2 of the optical wave transmission layer 20 is less than a refractive index n3 of the photoresist layer 10.

In some embodiments, the photoresist structure is disposed in the first medium 3. The first medium 3, the optical wave transmission layer 20, and the photoresist layer 10 together form a propagation medium layer with a gradually increasing refractive index, such that when the incident beam sequentially passes through the first medium 3 and the optical wave transmission layer 20 to enter the photoresist layer 10, the wavelength of the optical waves entering the photoresist layer 10 is reduced, thereby improving the lithographic resolution.

In some embodiments, as shown in FIG. 9, the optical wave transmission layer 20 has a thickness h1, and the photoresist layer 10 has a thickness h2. Referring to FIG. 10, the first incident beam 5 passing through the first medium 3 to enter the optical wave transmission layer 20 has a first wavelength $\lambda 1$, where the thickness h1 of the optical wave transmission layer 20 is greater than $\frac{1}{10}$ of the first wavelength $\lambda 1$, that is $$h1 > \frac{\lambda 1}{10},$$

and h1 is less than h2.

In some embodiments, the thickness of the optical wave transmission layer 20 is less than $\frac{1}{5}$ of the thickness h2 of the photoresist layer 10, that is, $$h1 < \frac{h2}{5},$$

which reducing the difficulty of stripping the optical wave transmission layer 20 while ensuring that the thickness h2 of the photoresist layer 10 satisfies the development requirement.

According to an exemplary embodiment, the optical wave transmission layer is made of a light-transmitting material, such that the incident beam can pass through the optical wave transmission layer to enter the photoresist layer 10, ensuring the implementation of the exposure processing.

According to an exemplary embodiment, as shown in FIG. 9, the material of the optical wave transmission layer 20 includes an ionic polymer. The material of the optical wave transmission layer 20 and the material of the photoresist layer 10 have different dissolution characteristics, such that the optical wave transmission layer 20 can be conveniently removed from the photoresist layer 10.

In the method of forming a photoresist pattern and the photoresist structure according to some embodiments, the optical wave transmission layer 20 reduces the wavelength of light entering the photoresist layer 10, which improves the lithographic resolution and the precision of the photoresist pattern.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Although the steps in the flowcharts of FIG. 1 to FIG. 6 are sequentially connected, these steps are not necessarily performed in the order of the connection. The execution order of the steps is not strictly limited, and the steps may be executed in other orders, unless clearly described otherwise. Moreover, at least some of the steps in FIG. 1 to FIG. 6 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of forming a photoresist pattern and a photoresist structure that are provided by the embodiments of the present disclosure, the optical wave transmission layer reduces the wavelength of exposure light entering the photoresist layer, which improves the resolution and the precision of the photoresist pattern.

The invention claimed is:

1. A method of forming a photoresist pattern, comprising:
   forming a photoresist structure on a target layer, wherein the photoresist structure comprises a photoresist layer provided on the target layer, and an optical wave transmission layer provided on the photoresist layer; and
   performing exposure processing on the photoresist structure in a first medium, and forming an exposure image in the photoresist layer, wherein the optical wave transmission layer is configured to improve lithographic resolution of the photoresist layer;
   wherein the forming a photoresist structure on a target layer comprises:
   coating the target layer with a photoresist solution, wherein the photoresist solution comprises a photoresist composite and a light-transmitting ionic polymer;
   performing soft baking on the target layer coated with the photoresist solution, and evaporating a solvent in the photoresist solution;
   diffusing the photoresist composite to the target layer to form the photoresist layer on a top surface of the target layer; and
   diffusing the ionic polymer towards a direction away from the target layer, wherein the ionic polymer forms the optical wave transmission layer on a top surface of the photoresist layer;
   wherein the performing exposure processing on the photoresist structure in a first medium, and forming an exposure image in the photoresist layer comprises:
   transmitting first incident beam to the photoresist structure, wherein the first incident beam has a first wavelength, the first incident beam passes through the first medium to enter the optical wave transmission layer, and the first incident beam is refracted by the optical wave transmission layer and becomes a second incident beam having a second wavelength that is less than the first wavelength, wherein
   the second incident beam enters the photoresist layer, and the second incident beam forms the exposure image in the photoresist layer;
   wherein a thickness of the optical wave transmission layer is greater than $\frac{1}{10}$ of the first wavelength, and the thickness of the optical wave transmission layer is less than ⅕ of a thickness of the photoresist layer.

2. The method of forming a photoresist pattern according to claim 1, wherein a refractive index of the optical wave transmission layer is greater than a refractive index of the first medium, and is less than a refractive index of the photoresist layer.

3. The method of forming a photoresist pattern according to claim 1, wherein the exposure processing is performed in an exposure apparatus, and the performing exposure processing on the photoresist structure further comprises:

adjusting the exposure apparatus, such that a focal plane for imaging of the exposure apparatus is located in the photoresist layer.

4. The method of forming a photoresist pattern according to claim 3, wherein the adjusting the exposure apparatus, such that a focal plane for imaging of the exposure apparatus is located in the photoresist layer comprises:

obtaining a refractive index of the first medium, a refractive index of the optical wave transmission layer, the thickness of the optical wave transmission layer, a refractive index of the photoresist layer, and the thickness of the photoresist layer; and adjusting a focal plane for imaging of the exposure apparatus according to the refractive index of the first medium, the refractive index of the optical wave transmission layer, the thickness of the optical wave transmission layer, the refractive index of the photoresist layer, and the thickness of the photoresist layer, such that the focal plane is located in the photoresist layer.

5. The method of forming a photoresist pattern according to claim 3, wherein along a stacking direction, the focal plane for imaging of the exposure apparatus is formed in a plane in which a central line of the photoresist layer is located, and the photoresist layer is located between a front focal depth and a back focal depth for imaging of the exposure apparatus.

6. The method of forming a photoresist pattern according to claim 1, wherein a mass percentage of the ionic polymer in the photoresist solution is 5% to 20%.

7. The method of forming a photoresist pattern according to claim 1, further comprising:

removing the optical wave transmission layer.

8. The method of forming a photoresist pattern according to claim 7, further comprising:

performing hard baking on the photoresist layer; and performing development processing on the photoresist layer, to pattern the photoresist layer to form a photoresist pattern.

9. The method of forming a photoresist pattern according to claim 1, further comprising:

providing a mask plate, wherein a mask pattern is formed on the mask plate; and performing exposure processing on the photoresist structure based on the mask plate.

* * * * *